(12) United States Patent
Purushothaman et al.

(10) Patent No.: US 8,563,396 B2
(45) Date of Patent: Oct. 22, 2013

(54) 3D INTEGRATION METHOD USING SOI SUBSTRATES AND STRUCTURES PRODUCED THEREBY

(75) Inventors: Sampath Purushothaman, Armonk, NY (US); Roy R. Yu, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 13/016,994

(22) Filed: Jan. 29, 2011

(65) Prior Publication Data

US 2012/0193752 A1      Aug. 2, 2012

(51) Int. Cl.
*H01L 21/60*     (2006.01)
(52) U.S. Cl.
USPC .................................. 438/443; 257/E21.563

(58) Field of Classification Search
USPC .......... 257/347, E21.249, E21.563, E25.027; 438/425, 443, 455, 459, 474, 479, 622
See application file for complete search history.

(56) References Cited

U.S. PATENT DOCUMENTS

2007/0267723 A1 *  11/2007  Bernstein et al. ............. 257/621

* cited by examiner

*Primary Examiner* — Thomas L Dickey
(74) *Attorney, Agent, or Firm* — Robert J. Eichelburg; The Law Offices of Robert J. Eichelburg (57) ABSTRACT

A process and resultant article of manufacture made by such process comprises forming through vias needed to connect a bottom device layer in a bottom silicon wafer to the one in the top device layer in a top silicon wafer comprising a silicon-on-insulator (SOI) wafer. Through vias are disposed in such a way that they extend from the middle of the line (MOL) interconnect of the top wafer to the buried oxide (BOX) layer of the SOI wafer with appropriate insulation provided to isolate them from the SOI device layer.

8 Claims, 13 Drawing Sheets

3D INTEGRATION METHOD USING SOI SUBSTRATES AND STRUCTURES PRODUCED THEREBY

DESCRIPTION OF THE INVENTION

1. Field of the Invention

The field of the invention comprises semiconductor devices having via interconnects and processes for manufacturing these devices.

2. Background of the Invention

Device interconnections in Very Large Scale Integrated (VLSI) or Ultra-Large Scale Integrated (ULSI) semiconductor devices or chips typically have multilevel structures containing patterns of metal wiring layers encapsulated in an insulator. Wiring structures within a given level of wiring are separated by an intra level dielectric, while the individual wiring levels are separated from each other by layers of an inter level dielectric. Conductive vias are formed in the inter level dielectric to provide inter level contacts between the wiring traces.

The scaling of 2D devices faces challenges such as integration of different chip functionalities required in advanced processor systems. Industry is looking to 3D integration (3DI) of devices to achieve these ends. One element needed in 3DI schemes comprises through substrate (usually Si) via connections to enable connection between device layers as well as input/output (I/O) connection to the external components. Prior art processes describe etching deep (about 20 micron to about 150 micron) through Si vias filled with tungsten or copper as a means to enable these connections. These vias are difficult to fabricate in the traditional complementary metal oxide semiconductor (CMOS) fabrication environment and present cost and reliability issues. Alignment of patterns required on the bonded and thinned wafer assembly often requires the use of alignment marks produced using the same deep silicon etch and fill process concurrently with the through via formation. Such marks are not easy to produce with good fidelity and as such are not very conducive for reliable litho alignment. In the present invention we present an alternative way to achieve through device layer via connections by taking advantage of the use of silicon-on-insulator (SOI) substrates.

Industry experienced problems in standard through joining and face-to-face joining 3DI. Some of these problems include expensive deep Si via etch and fill processing which is difficult to extend not only to smaller dimensions in the device but also devices having high aspect ratios.

Additionally, front-to-back alignment for post-thinning lithography is limited by the quality of the marks formed by deep thru Si filled vias in the process. Also, topography of the back side of the device after thinning (W and/or Si) can be high and may not be easy to planarize.

One attempt to overcome these and other related problems comprises a so-called via plus riveting approach to 3DI which eliminates deep Si vias but requires etching through the back end of the line (BEOL), middle of the line (MOL), and front end of the line (FEOL) dielectric layers after the device is fully built. This is an alternate approach that will allow formation of Cu thru vias.

SUMMARY OF THE INVENTION

Accordingly, the present invention provides structures, articles of manufacture and processes that address these needs to not only provide advantages over the related art, but also to substantially obviate one or more of the foregoing and other limitations and disadvantages of the related art. Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, through vias needed to connect the device layer in the bottom wafer to the one in the top device layer are formed in the top silicon wafer which comprises a SOI wafer. Thus the structures involved according to the invention comprise (1) a top wafer, (2) a top device layer, (3) a bottom device layer, (4) a bottom wafer all of which are operatively associated with one another to form a 3D semiconductor device. These vias comprise through vias, disposed in such a way that they extend from the middle of the line (MOL) interconnect of the top wafer to a buried oxide (BOX) layer of the SOI (top) wafer with appropriate insulation provided to isolate the vias from the SOI layer.

Middle of the line or MOL, as commonly known in the art, and used above refers to the interconnection means between the source, drain and gate electrodes of individual transistors in semiconductor chips and comprise contact vias (also known as CA) and the local or very short length interconnection wires that connect the various transistors on the chip into operational circuitry on the chips. Back end of the line or BEOL refers to the additional levels of vias and interconnections wiring that enable connections between groups of transistors (sometimes also referred to as macros) and they tend to be longer than any local interconnects present in the MOL.

FIGS. 1 to 12 comprise side elevations in cross section to illustrate a process flow for the 3DI-via to BOX method of manufacturing a device according to the present invention, and FIG. 13 shows the cross section of one embodiment of the device itself.

DETAILED DESCRIPTION

To achieve these and other advantages, and in accordance with the purpose of this invention as embodied and broadly described herein, the following detailed embodiments comprise disclosed examples that can be embodied in various forms.

The specific articles of manufacture, processes, compounds, compositions, and structural details set out herein not only comprise a basis for the claims and a basis for teaching one skilled in the art to employ the present invention in any novel and useful way, but also provide a description of how to make and use this invention.

The present invention comprises a process and resultant article of manufacture made by such process in which through vias needed to connect the device layer in the bottom wafer to the one in the top device layer are formed in the top silicon wafer which comprises a silicon-on-insulator (SOI) wafer. Through vias are disposed in such a way that they extend from the middle of the line (MOL) interconnect of the top wafer to the buried oxide (BOX) layer of the top SOI wafer with appropriate insulation provided to isolate them from the SOI device layer.

The metal fill for the via can be tungsten or a sacrificial material that can be later removed and replaced after the bonding and thinning operations which we describe later. As the depth of such vias will be typically about a few microns or less, one can use standard CMOS fabrication tools to perform the necessary reactive ion etch (RIE), via fill and planarization steps. Thus the need for deep Si etch and fill tools and processes are obviated. Also, the necessary marks required for lithographic alignment from the back side after bonding, grinding and polishing are also formed with good fidelity in the same process used to form the through device layer vias. Vias are preferably filled with tungsten as it is the commonly used MOL via material. The top SOI wafer is bonded to the bottom device wafer using prior art methods such as Cu—Cu bonding or thin film transfer joining (combining metal to metal as well as adhesive based bonding) with or without lock and key alignment features between the joined wafers. The top SOI wafer is then thinned using grinding, polishing and wet or RIE etching such that all of the silicon substrate is removed, stopping selectively on the BOX layer. Since the etch stop layer of BOX is used, excellent back side planarity is achieved unlike the standard 3DI process where non-uniformities in the deep silicon etch and fill as well as the back side thinning process lead to a significant topography that need to be planarized.

At this juncture the bottom of the through device layer vias and any alignment marks made in that level are visible through the BOX layer. Lithography and subsequent processing can be performed in a facile manner to open and connect to the contacts to the through device layer vias, and provide any additional wiring interconnects and form the I/O terminals for the composite chip to communicate with the external devices through the packaging architecture.

In a variant of this process, we can fill the through device via locations during the initial build with a sacrificial material (such as poly silicon or amorphous silicon) which can be later etched out after the back side contacts are opened. The via openings thus exposed can then be filled with a BEOL interconnect stack (TaN/Ta/Cu for example). This option can be used if lower electrical and thermal resistance than that afforded by tungsten vias is desired.

The remainder of the 3DI process flow in terms of fabrication of the device and other wiring layers, joining together of wafers etc are kept the same in the current method while only the difficulties associated with deep silicon via etch and fill are eliminated. This method is an alternative to a process flow which employs the formation of the through device vias as the last step in the BEOL processing of the SOI wafer. The present invention avoids the need for etching vias through several BEOL layers which is required in that process flow.

The foregoing distinguishes the present invention from prior methods and articles of manufacture and provides a new approach to making these devices in that the through via fist embodiment of this invention is like the standard 3DI vias, but these vias are only etched to the BOX layer. The process also utilizes through via etching and isolation at the MOL level unlike prior methods, and does not require drilling through all of the BEOL layers of the through via wafer, unlike the via last approach. Additionally, the process and article of the invention comprise formation of front to back lithography alignment marks created by about 1 um deep etched features and hence are expected to have significantly better shape fidelity than marks obtained after deep silicon etching and filling. The latter are more prone to shape distortion resulting from the deep etch and the associated undercut and dimension control issues.

With the present invention, we can preserve and use all favorable elements of the lock and key face to face join process known in the art. In another embodiment of the invention, and if preferred, one can fill some through vias with a sacrificial fill, which is removed after thinning, the top wafer and fill with a BEOL fill material selected on the basis of thermal and/or electrical conductivity.

It is possible to use a bulk silicon (non-SOI) wafer for the bottom wafer (or second wafer in our terminology) if preferred to reduce costs. As this wafer is not processed in the manner of the top (or first wafer) by taking advantage of the BOX layer, it is acceptable to choose a bulk silicon wafer as the bottom wafer in the 3DI stack. Bulk silicon type wafers are used in application specific integrated circuit devices (ASIC's) which can then be combined with devices in the top SOI wafer in the bonded 3DI structure to produce useful functionalities in the 3D device.

The key challenges addressed by the present invention include, inter alia, demonstrating the thinning of a top wafer to BOX (buried oxide) after joining the two wafers together with high yield using joining methods known in the art such as transfer joining. It is imperative to demonstrate that the complete removal of the silicon substrate form the top SOI wafer can be done after bonding using the BOX layer as the etch stop. Other challenges include parasitic issues due to the proximity of the interconnect wiring placed on top of the composite structure to the devices in the SOI layer of top wafer. We theorize that a thicker BOX layer may alleviate all of the foregoing concerns, but we do not limit ourselves by any theory.

The sequence shown in FIGS. 1 to 12 shows one exemplary method of the invention and the article of manufacture produced thereby using face to face Cu—Cu joining, and tungsten fill for vias and alignment marks. In other embodiments the approach taken with the present invention can be readily used along with lock and key transfer joining with adhesives; the alignment marks may be filled with materials other than tungsten such as molybdenum, ruthenium, nickel, cobalt copper and the like, mixtures thereof and alloys thereof.

the through vias may be filled with copper but this requires the use of a sacrificial thru plug via, i.e., a process where we remove any sacrificial plug after backside thinning followed by filling with copper.

In another embodiment of the invention, the BOX layer can alleviate both parasitic issues due to the proximity of the backside BEOL to SOI, but also mitigate the issue of possible relaxation of channel strain when Si of the first wafer is removed after bonding.

With the present invention, etching BOX, selective to the Si body is now feasible. Examples of this process comprise an oxide (or nitride) RIE with better than about 10:1 selectivity to Si. In this process we employ power of about 100 Watts, pressure of about 40 mT, with a process gas flow comprising CHF3 flow rate of about 40 sccm (standard cubic centimeters per minute), and oxygen flow rate of about 2.5 sccm. The oxide etch rate is about 250 A/min blank, about 125 A/min in patterned trenches, wherein the Si rate is not detectable. In another example we employ a RIE process developed for a low K dielectric which exhibits better than about 10:1 selectivity of etch rate of oxide to Si. In this RIE process the power is about 100 W, pressure is about 40 mT, with a process gas flow comprising CHF3 flow rate of about 40 sccm, oxygen flow rate of about 2.5 sccm, and nitrogen flow rate of about 10 sccm.

Furthermore, with the present invention, selectivity in etching the back side of the top silicon substrate and stopping on BOX is also feasible. Examples of this process comprise Si RIE with better than about 100:1 selectivity to oxide. In this process we employ a power of about 200 W, pressure of about 30 mT, with a process gas flow comprising CFH3 flow rate of about 30 scan, oxygen flow rate of about 2.5 seem, and sulfur hexafluoride low rate of about 30 sccm. The Si etch rate is about 10 um/60 min, and the oxide rate is about <0.1 um/60 min. We can also employ an alternative process in this aspect of the invention comprising a KOH wet etch, known to etch Si with high selectivity to BOX.

Description of Process Sequence for One Illustrative Embodiment

Figure 1:
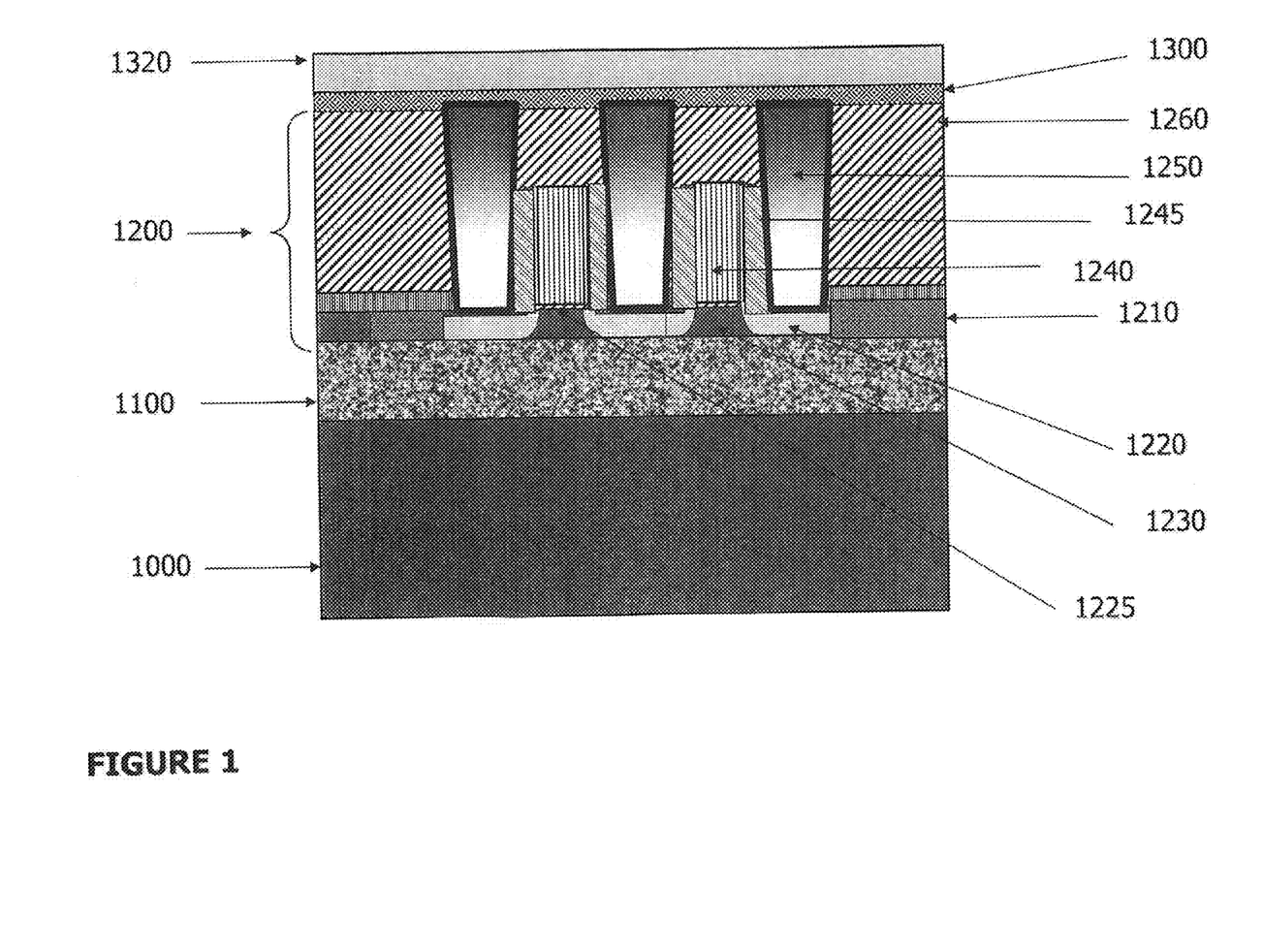
FIG. 1 shows a close up view of a first SOI wafer cross section after the device and MOL regions are fabricated.

FIG. 1 shows a close up view of the cross section of a typical SOI device wafer known in the art. This wafer which we denote as the first wafer in our 3DI assembly comprises a buried silicon oxide (BOX) layer 1100 disposed on bulk silicon body 1000 of the wafer. The BOX layer 1100 is typically about 100 nm thick but can be made thicker if desired. The active silicon device channels about 1230 are patterned on top of the BOX layer 1100 and are isolated from other device channels by shallow trench isolation (STI) regions 1210 typically comprising insulators such as silicon nitride and silicon oxide. Source/drain silicide contacts 1220 are provided to the channels 1230 to achieve electrical connection to the device. Source drain contacts in turn are connected to contact vias (also known as CA contacts) 1250 which enable interconnection of several adjacent device channels to form useful circuitry. Gate electrodes 1240 insulated on the sides by spacer dielectric 1245 are disposed atop a gate insulator 1225 which in turn electrically isolates the gate electrode 1240 from the silicon channel 1230. Contacts to the gate electrodes are also made using CA vias (not shown in this view). Biasing the gate electrodes 1240 electrically enables signal amplification to be achieved in the SOI device shown. Also shown in FIG. 1 are MOL insulation dielectric 1260, MOL top passivation dielectric 1300 and a hard mask layer 1320 to be used in subsequent patterning. While MOL dielectric 1260 can be made of silicon oxide, low dielectric constant carbon doped oxide and the like, layer 1300 is typically made of silicon nitride or silicon carbonitride. Hard mask layer 1320 can be silicon oxide, an organic layer or a combination thereof so as to provide etch selectivity for the subsequent through via patterning step described next.

Figure 2:
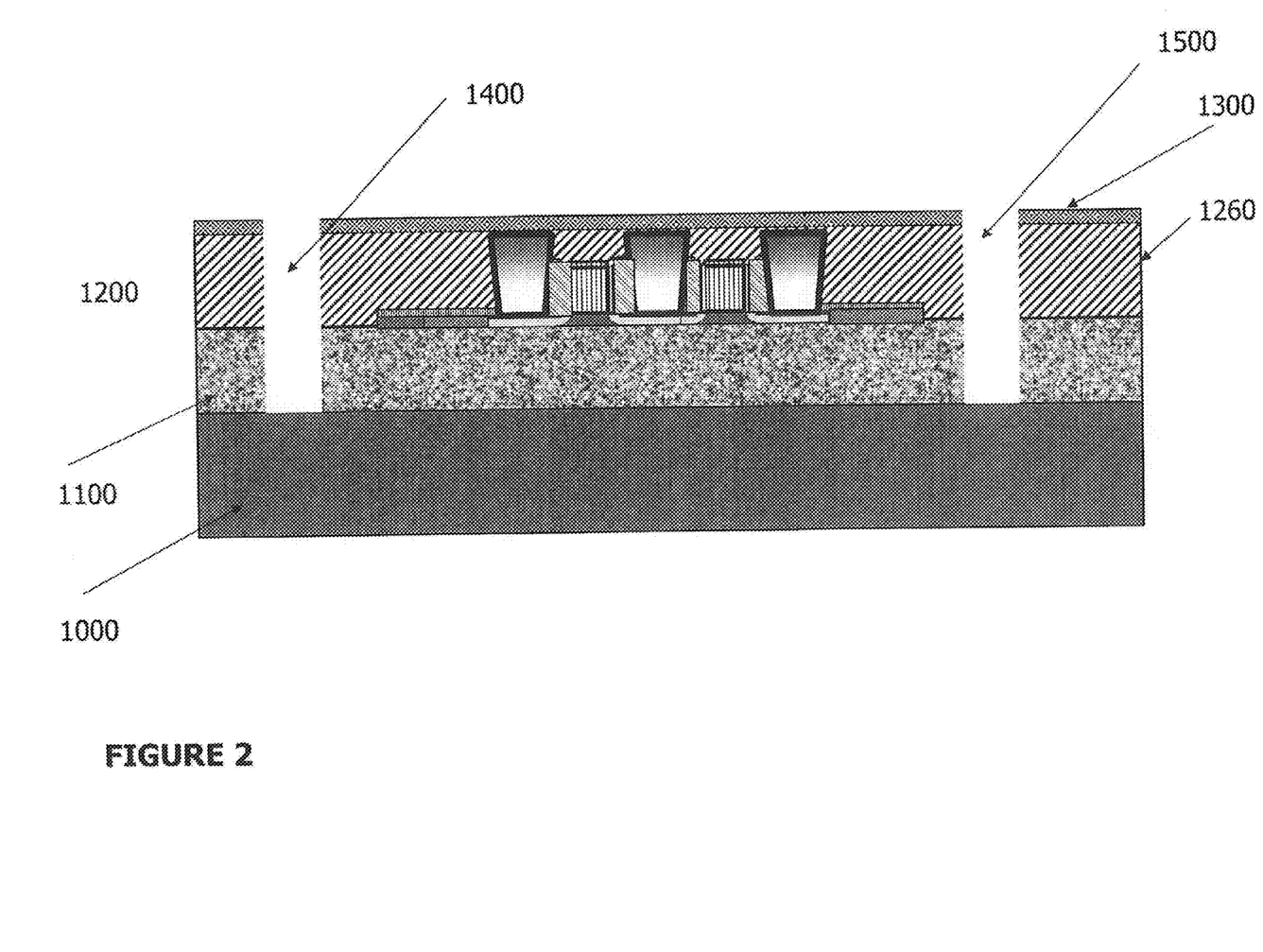
FIGS. 2 to 6 show the process sequence that is required to add the additional features that form the BEOL as well as 3DI unique features to the point where the wafer is ready for a 3D bonding step.

In the next step, a photoresist layer is applied on hard mask 1320 and through via pattern is imaged in the same and transferred by reactive ion etching (RIE) into the hard mask 1320, passivation layer 1300 and the MOL dielectric 1260, the BOX layer 1100 stopping on the surface of the silicon body 1000. Etching of BOX layer selective to the silicon body using one of the recipes described earlier is required for this step. The resulting cross section after the resist and the hard mask have been stripped off is shown in FIG. 2. It should be noted that the through vias 1500 and 1400 formed thus are located in regions where they do not intersect the devices or the STI features in the first wafer. Use of appropriate RIE process combinations as described earlier allows the etch process to stop selectively on the silicon body 1000 after etching through the BOX layer 1100.

Figure 3:
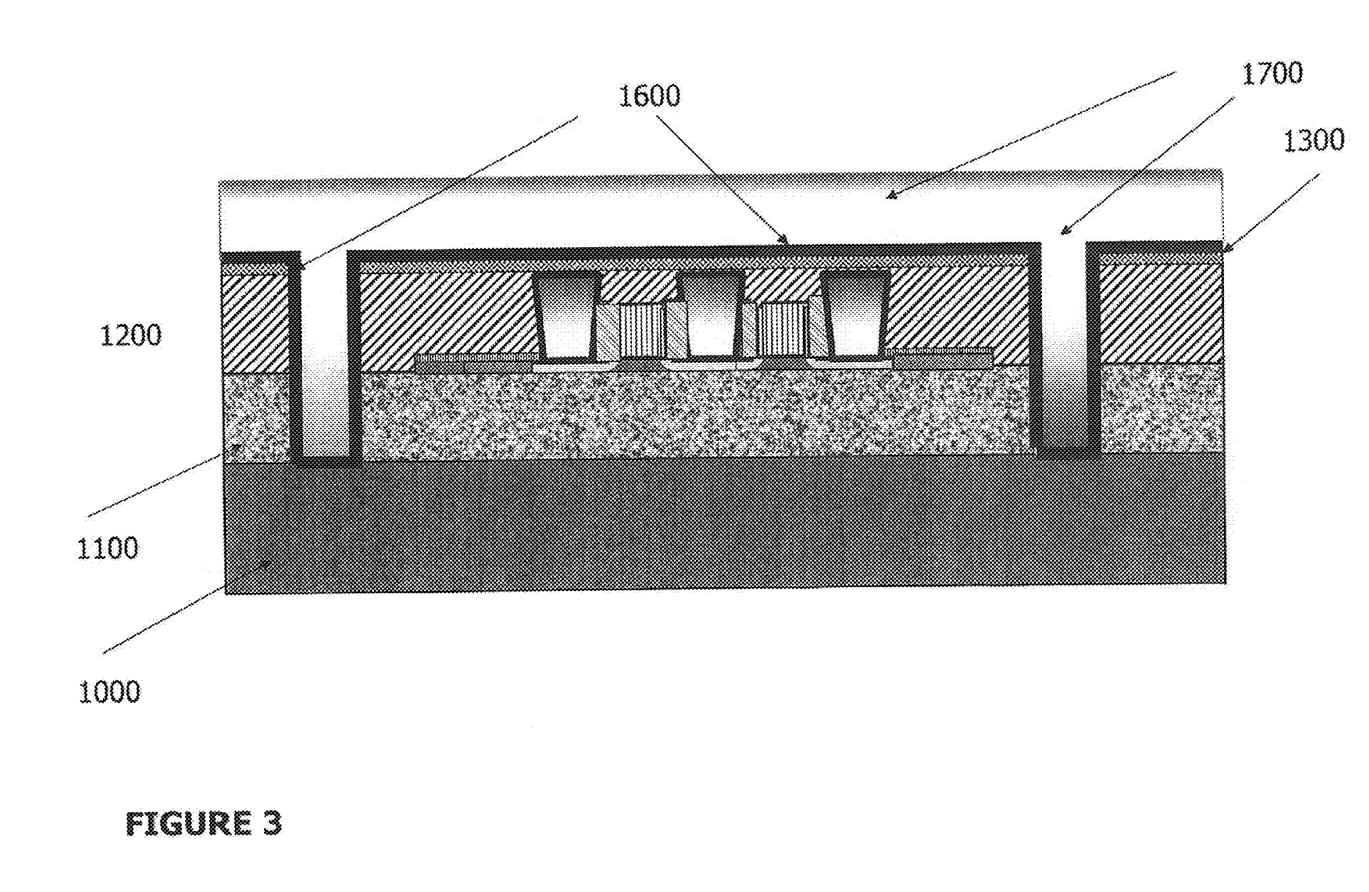

Next an insulating protective liner 1600 is conformally deposited on all the exposed surfaces as shown in FIG. 3 and the openings 1400 and 1500 are overfilled with a deposition of a fill metal 1700 such as tungsten. Other metal such as molybdenum, ruthenium and the like can also be used as mentioned earlier and optional adhesion layers or initiation layers could be deposited prior to the deposition of the metal fill 1700. Chemical vapor deposition (CVD) is best used for the deposition of layer 1700 although physical vapor deposition such as sputtering can also be used.

Figure 4:
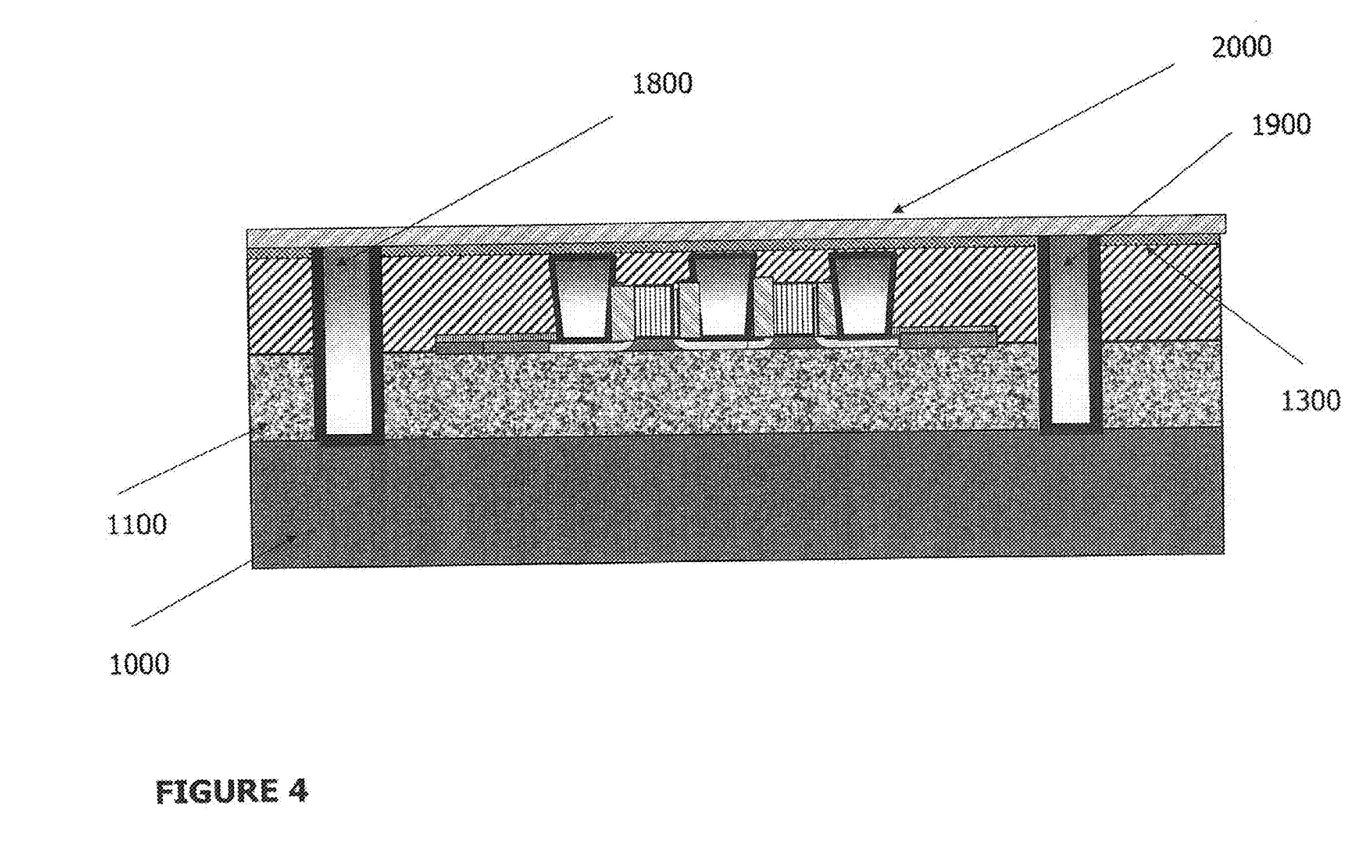

Next the overburden of the layers 1600 and 1700 is removed by a process such as CMP and a dielectric cap layer 2000 is deposited on top as shown in FIG. 4. Dielectric cap 2000 can be one of silicon nitride, silicon carbonitride and the like. The structure now comprises filled vias 1800 and 1900 as shown in FIG. 4.

Figure 5:
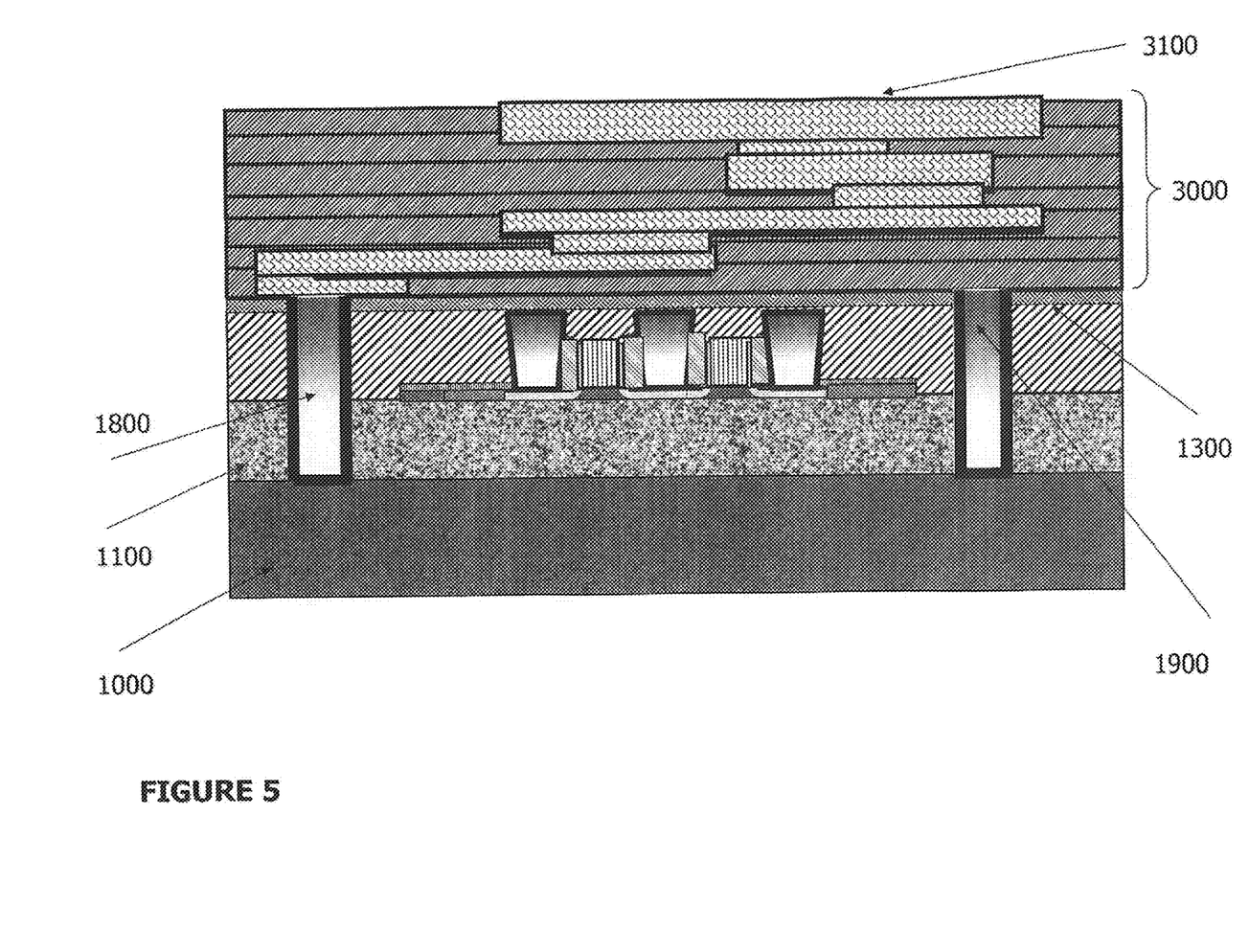

In the next sequence of steps the BEOL layers collectively denoted as 3000 in FIG. 5 of this first chip are completed. As noted in FIG. 5 vias of the type 1800 are electrically connected to the BEOL wiring while vias of the type 1900 are not. Vias of the type 1800 will be used later for electrical I/O means while it will be shown that vias of the type 1900 serve the purpose of alignment marks in a later process step. Metal features in the top most level of BEOL on this first wafer are exemplified by 3100 in FIG. 5.

Figure 6:
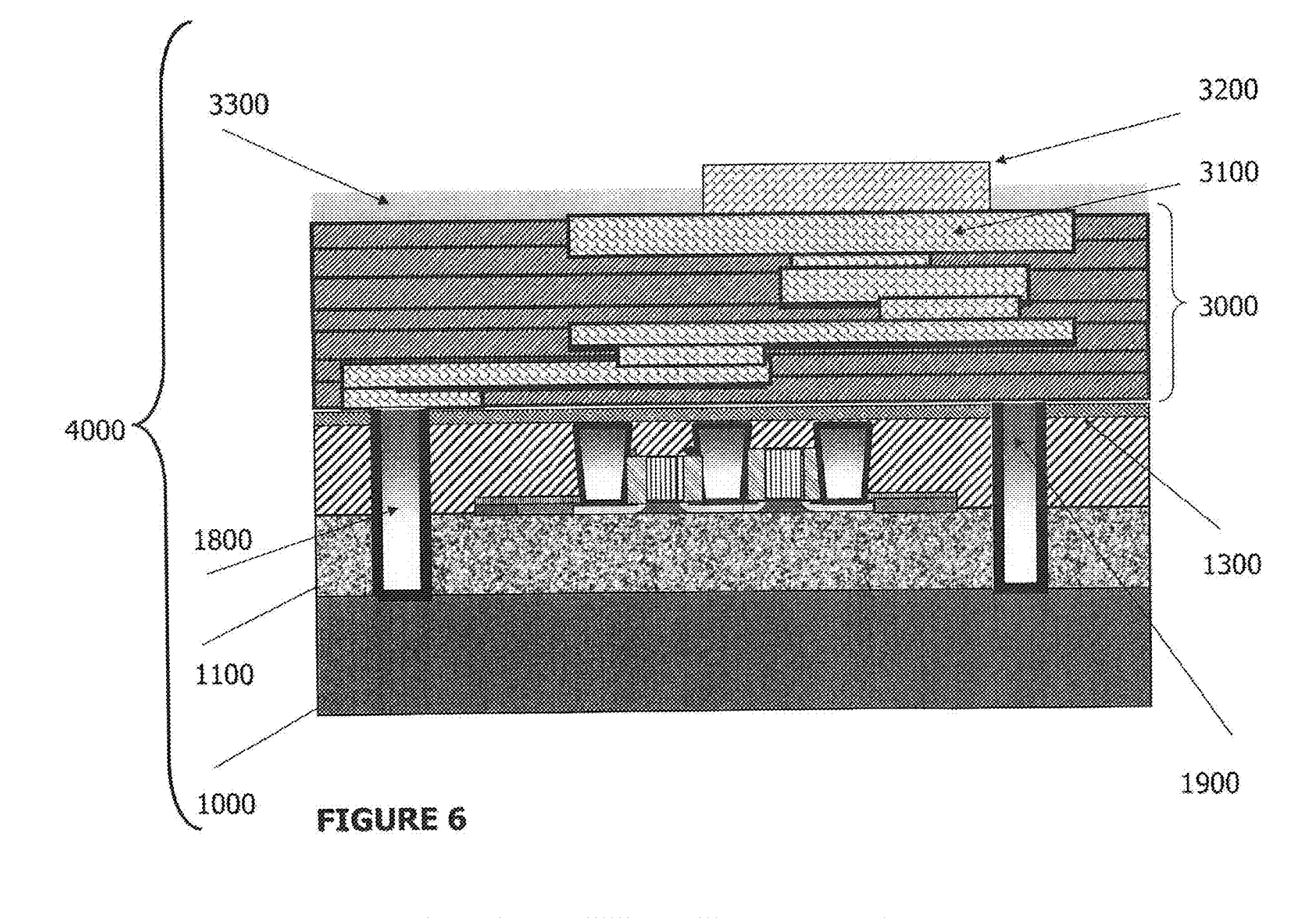

In the next set of steps, a metallic bonding pad level typified by 3200 is fabricated on some of the top BEOL features 3100 and these pads are surrounded by and isolated from each other by a recessed dielectric layer 3300 as depicted in FIG. 6. This structure can be conveniently fabricated by first fabricating a coplanar inlay of the bonding pads in the surrounding dielectric by damascene processing and then recessing the dielectric below the bonding pad by a wet or dry RIE process resulting in the structure shown in FIG. 6. Bonding pads are typically made of copper although additional layers such as Ni and Au can be added to protect the copper surface and enable more facile metal to metal bonding. This completes the fabrication of the first wafer 4000 to be used in the fabrication 3DI device structure.

Figure 7:
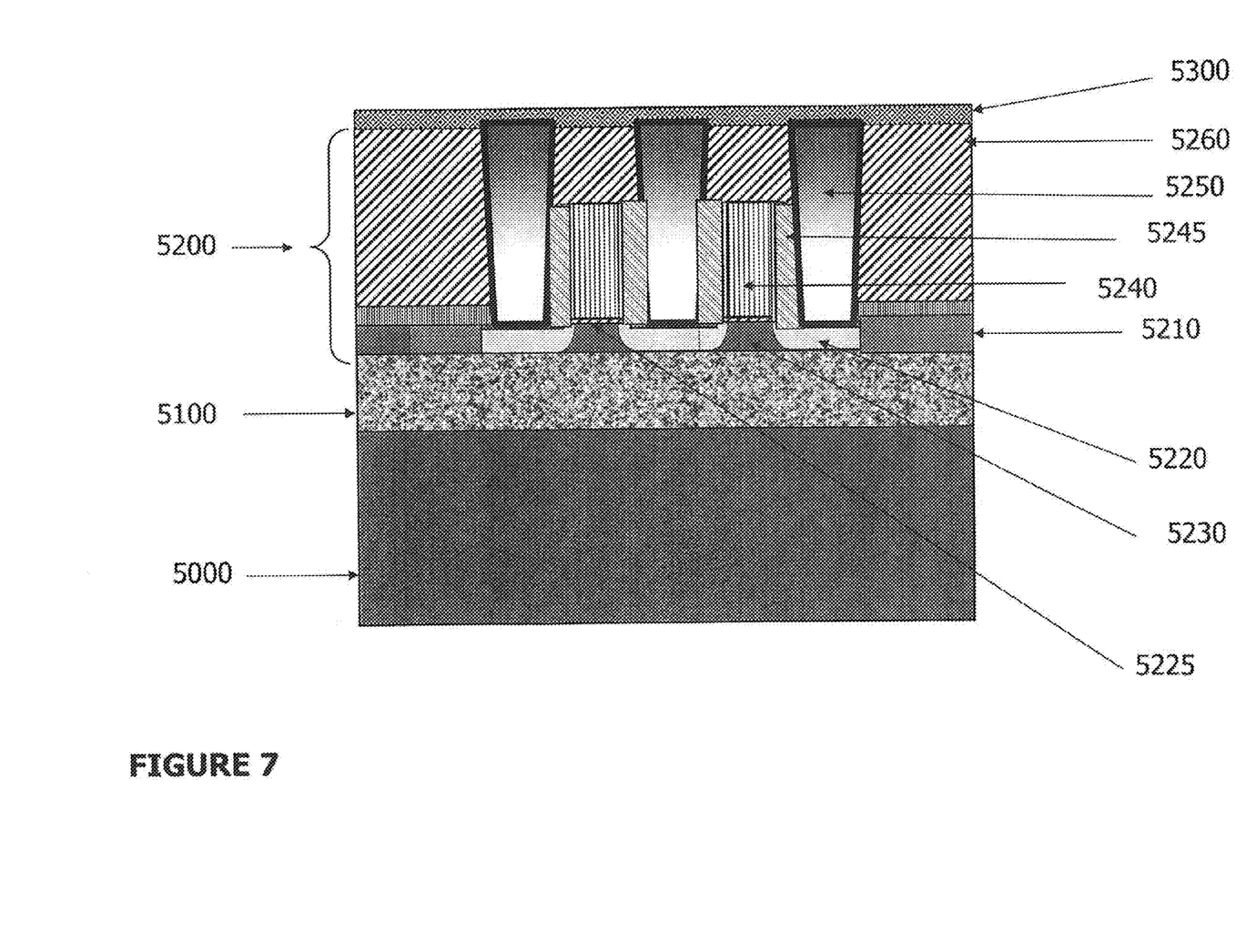
FIG. 7 shows a close up view of a second SOI wafer cross section after the device and MOL regions are fabricated.

FIG. 7 shows the second wafer to be used in the exemplary 3DI device stack after it has been processed through the FEOL and MOL layers. The numbering of the various layers and their description follows the same nomenclature as the ones shown in FIG. 1 except that the first digit of the numbers identifying the various features has been changed to 5 instead of 1 to denote the fact that they are disposed on the second wafer. Thus the second wafer comprises silicon body 5000, BOX layer 5100, FEOL region 5200 further comprising silicon channels 5230, source drain contacts 5220, STI dielectric regions 5210, gate dielectric 5225, gate electrodes 5240, spacer dielectric 5245, CA contacts 5250, MOL dielectric 5260, and MOL passivation 5300. As no vias are patterned and etched into this second wafer those steps performed on first wafer are skipped for the second wafer.

Figure 8:
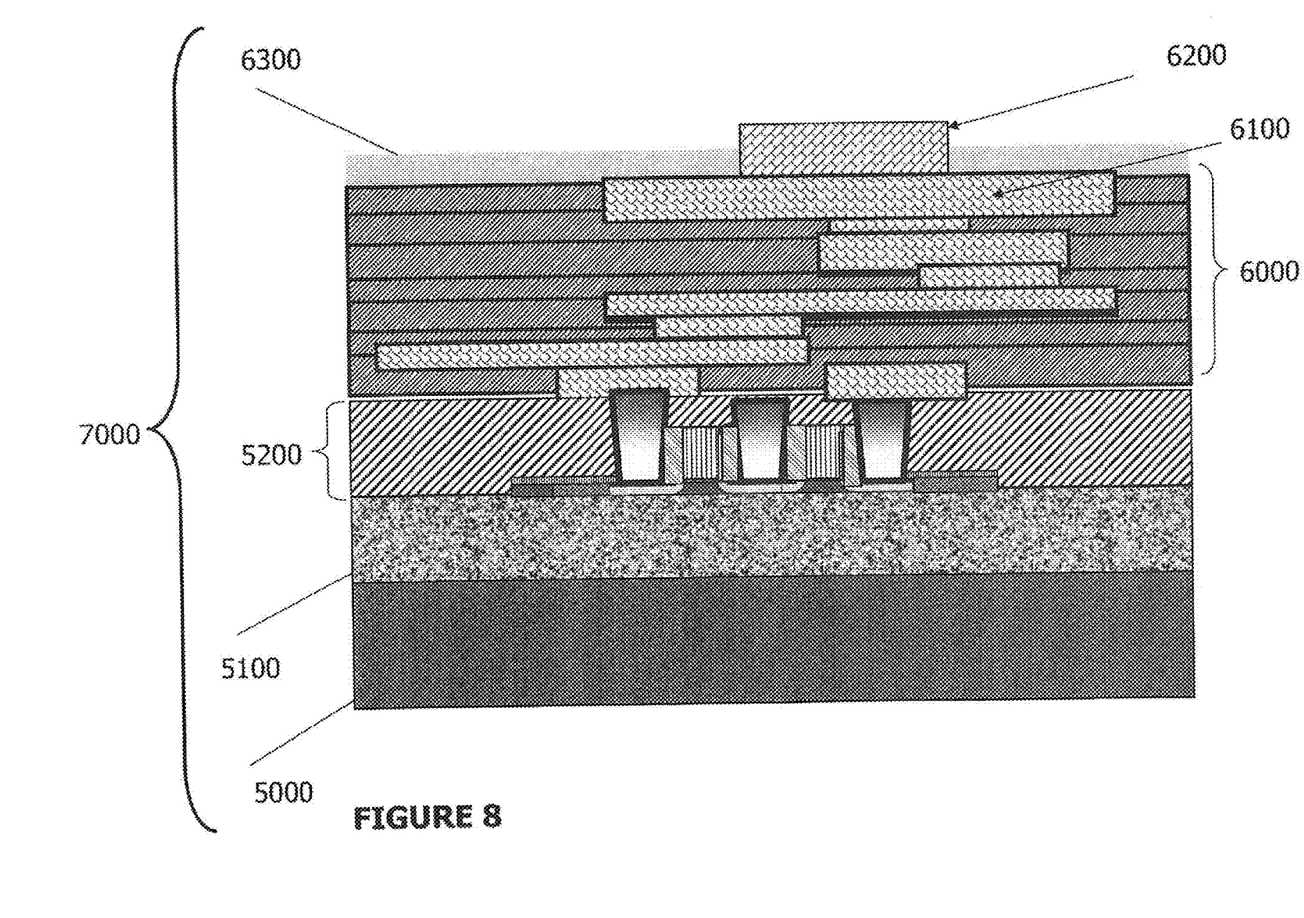
FIG. 8 shows this second wafer in cross section after the addition of BEOL as well as 3DI unique features to the point where the wafer is ready for a 3D bonding step.

Next BEOL layers 6000 terminated with upper level wiring features 6100 and bond pads 6200 in layer 6300 are built up in the same manner as described for the first wafer resulting in the finished second wafer 7000 shown in FIG. 8.

Figure 9:
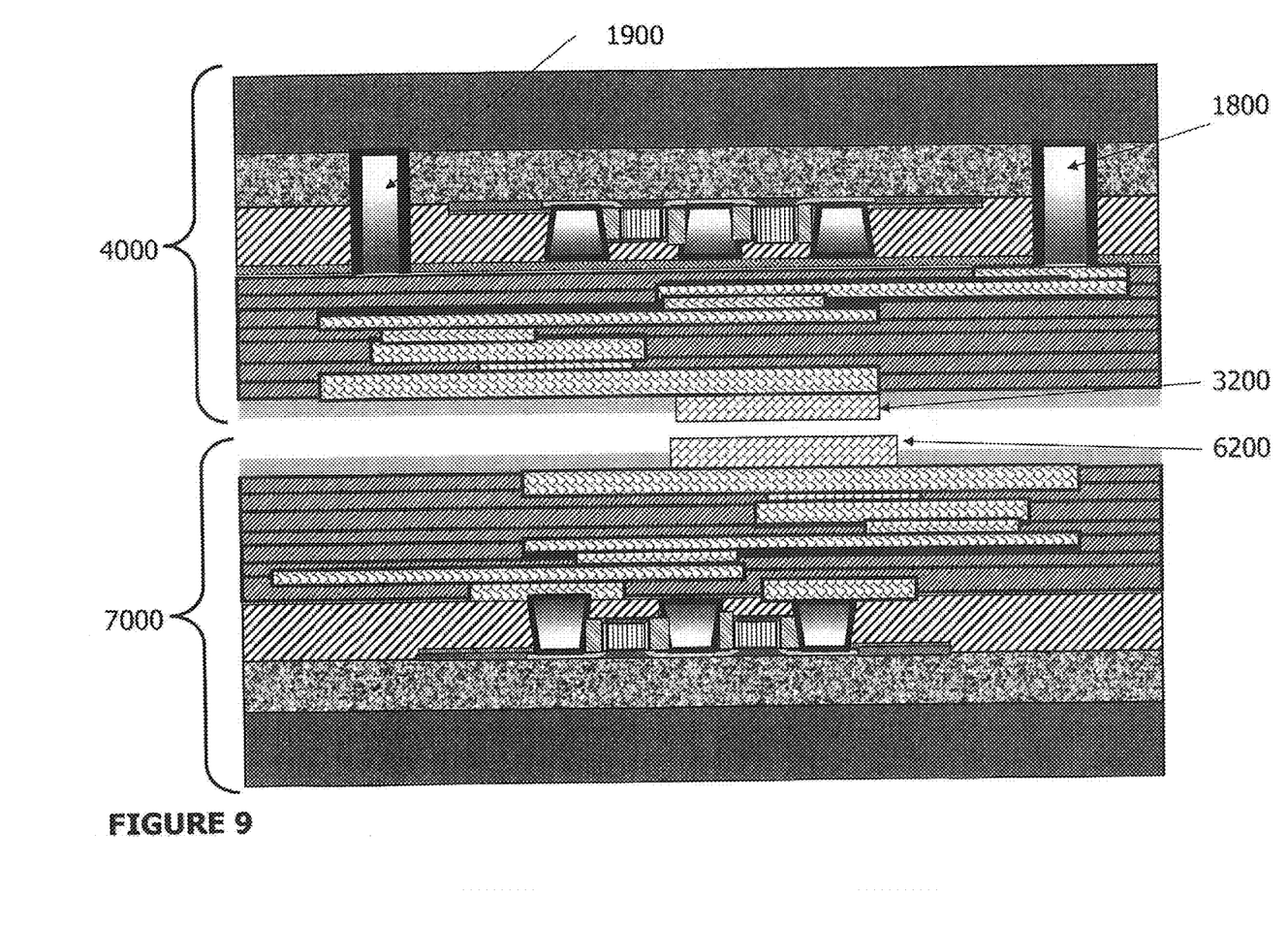
FIGS. 9 to 12 illustrate the process sequence entailed in aligning and bonding the first wafer on to the second wafer using copper to copper bonding as an illustrative bonding method followed by grinding, polishing and final wiring fabrication on the backside of the BOX layer of the first wafer in the bonded structure.

Next the first wafer 4000 is flipped and aligned to the second wafer 7000 as shown in FIG. 9 such that the bond pads 3200 on the first wafer and bond pads 6200 on the second wafer are precisely aligned to each other. Infrared microscopes, split optics and vision system methods can be used to enable precise alignment and commercial tools capable of enabling such alignment at one micron or better tolerance are available and can be used for this step. Bond pads 3200 and 6200 can be chosen to be of a relative size such that one is larger than the other to enable full capture of the smaller pad.

Figure 10:
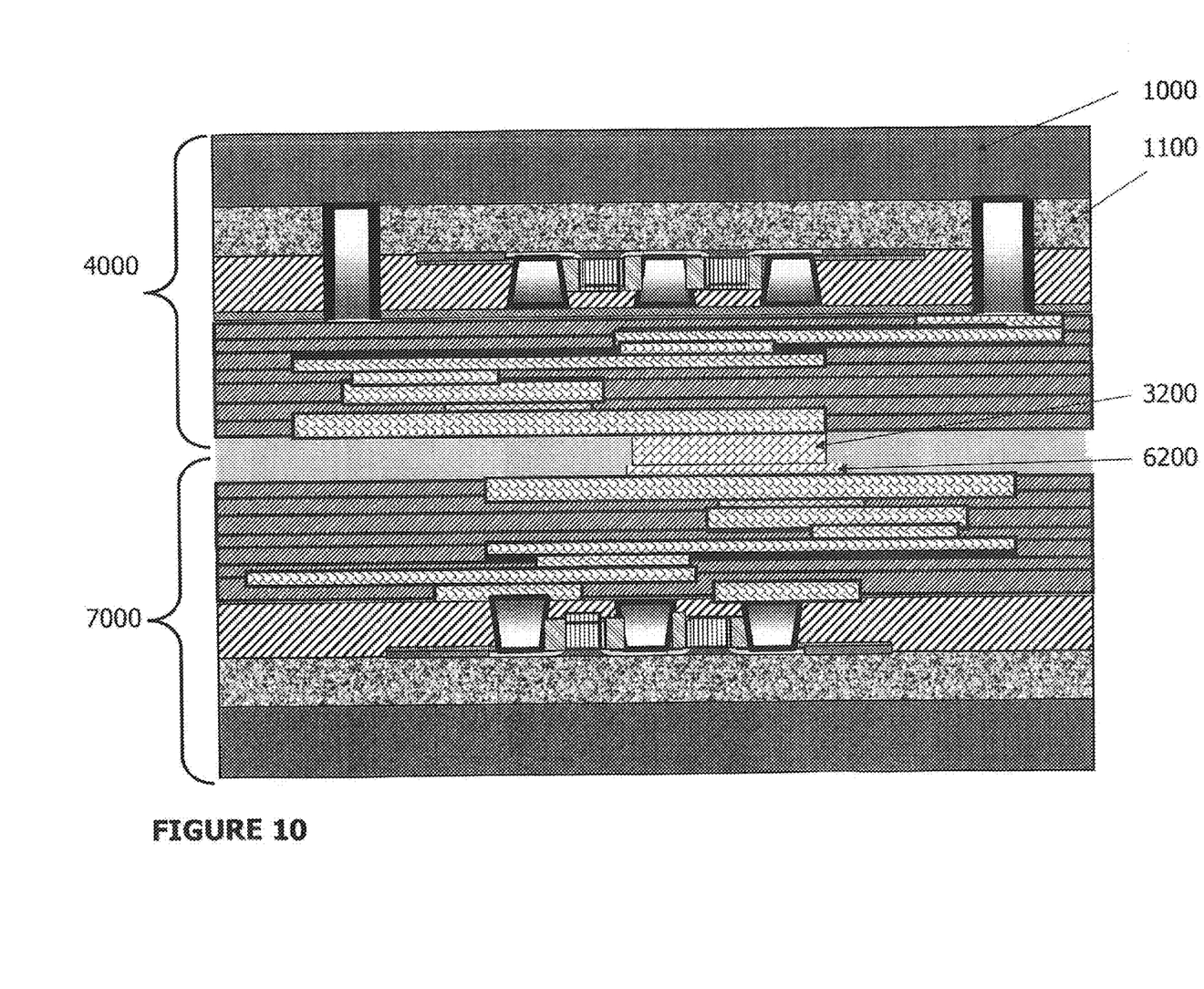

In the next step, the two wafers are brought into intimate contact with a concomitant application of elevated pressure and temperature in an inert, reducing gas or vacuum ambient to achieve bonding of the bonding pads 3200 and 6200. Pressures ranging from 50 to 1000 psi and temperatures ranging from 250 to 450 C can be used. Inert gases such as argon, helium or nitrogen or reducing gases such as hydrogen or forming gas (nitrogen/hydrogen mixture) can be used to keep the surfaces of the bond pads 3200 and 6200 pristine. More preferably a pressure in the range of about 100 to about 300 psi and temperature in the range of about 300 C to about 400 C could be used to effect the metal to metal bonding. A lamination press or pressure application using an autoclave or by means of a gas bladder could be employed to apply the requisite pressure for the bonding. The bonded stack at this stage is shown in FIG. 10.

Figure 11:
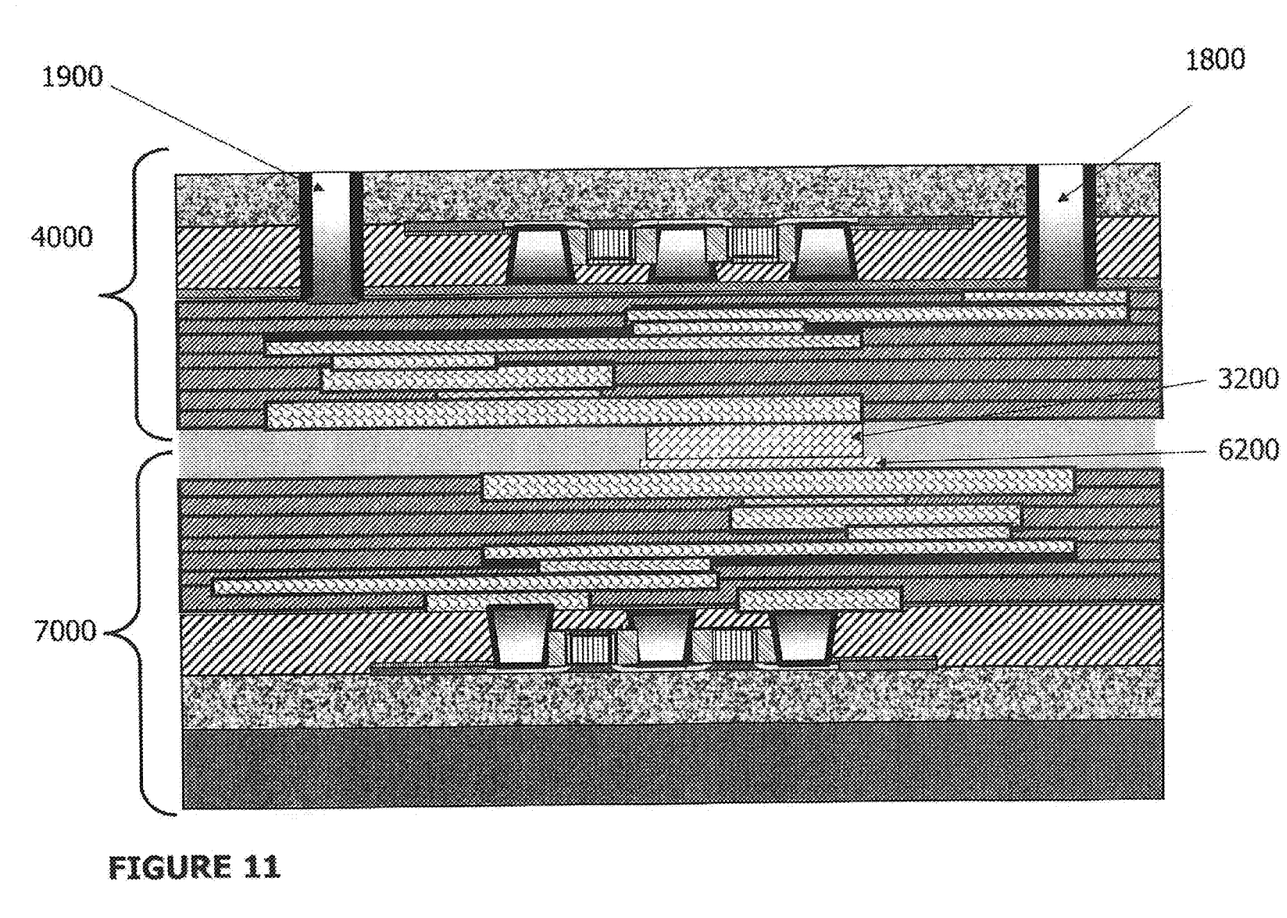

Once the bonding of the two wafers together is accomplished, in the next step the silicon body 1000 of the first wafer (now the top wafer in the bonded stack) is removed by a suitable combination of grinding, CMP and wet or dry RIE methods stopping selectively on the BOX layer 1100. RIE processes alluded to earlier are particularly beneficial to use to achieve this selectivity. The structure at this point in the process is shown in FIG. 11.

Figure 12:
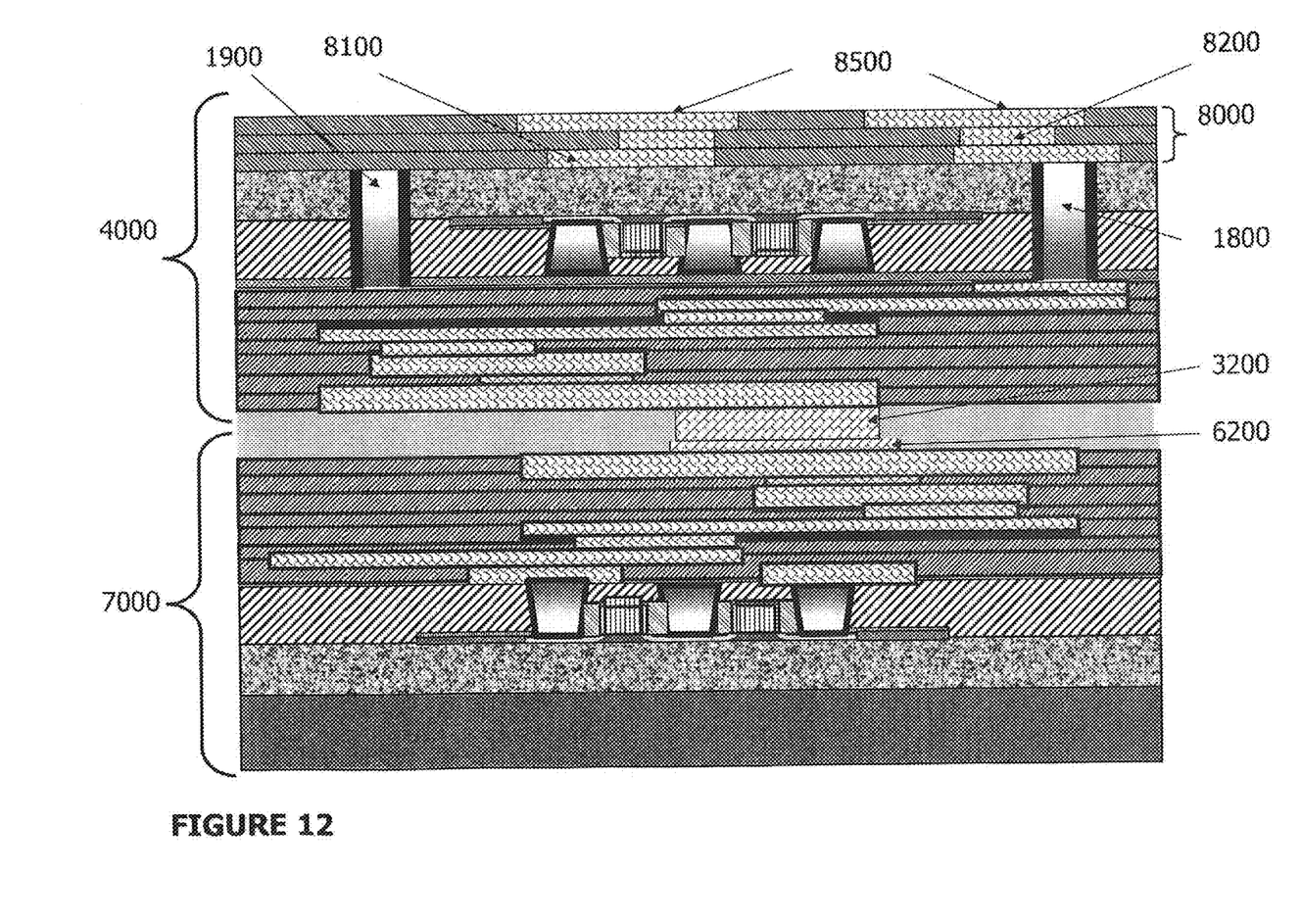

Additional wiring and interconnect layers 8000 comprising via levels 8200 wiring levels 8100 and 8500 are fabricated atop the structure as illustrated in FIG. 12. These layers connect to the circuitry in the second wafer 7000 through vias 1800 as shown. Additionally they can also provide other functions such as clock wiring for timing of circuits, power and ground nets required for operating the circuitry in the first and second wafer. In building up the interconnect layers 8000 the very first wiring layer 8100 uses vias 1900 exposed after the removal of the silicon body 1000 as alignment marks. By designing the shapes of vias 1900 appropriately one can make these features conducive to use as alignment marks with various lithographic tools that may be used for patterning the interconnect layer 8100. Because of the selective removal process used in the present invention, features such as alignment vias 1900 can be preserved with very high shape fidelity to enable ease of recognition and use for alignment purposes in lithographic imaging tools. Layers 8200 and 8500 can be aligned to features in layer 8100.

Figure 13:
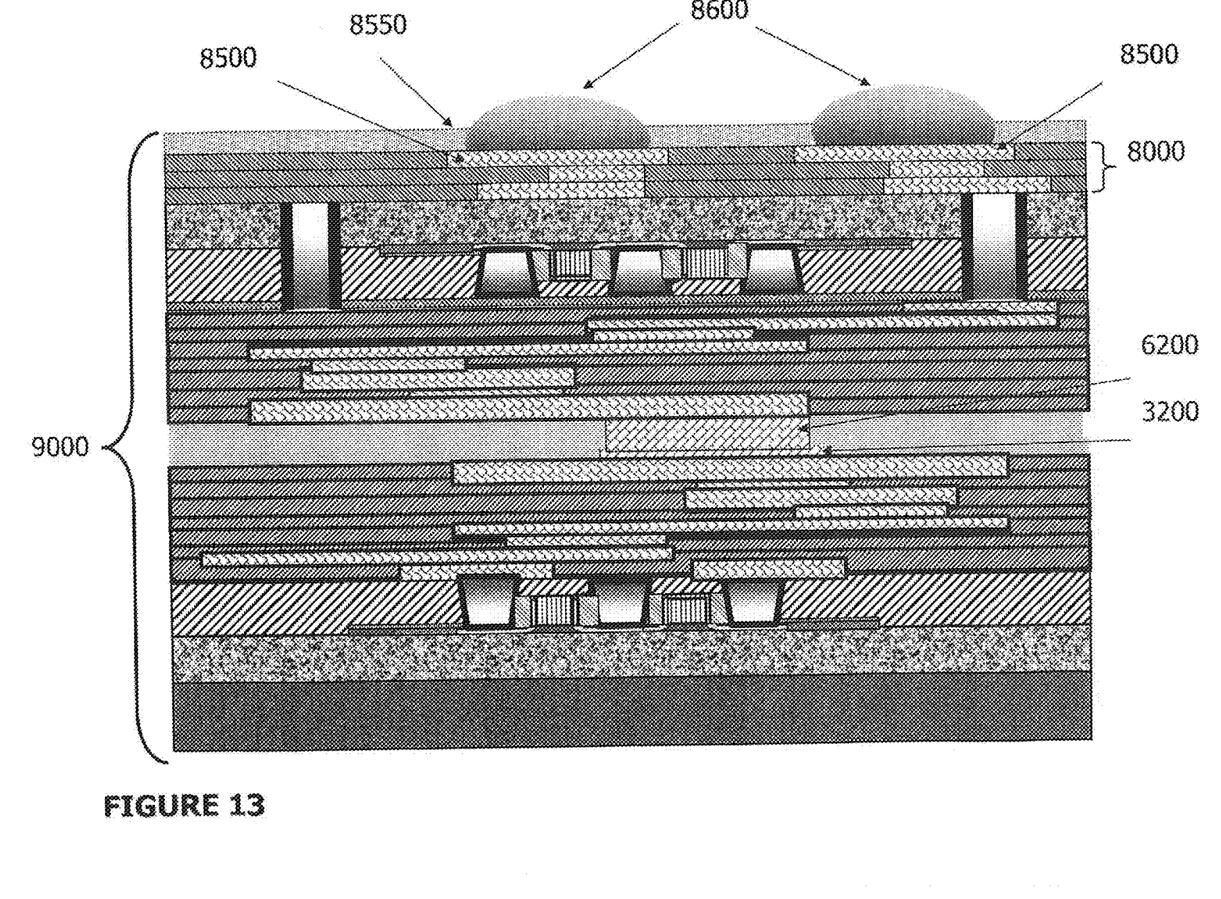
FIG. 13 illustrates the close up of the final cross section of the bonded 3D device also comprising input output (I/O) terminals in the form of C4 solder balls.

In the last sequence a final passivation layer 8550 is applied atop the structure 9000 and contact holes are opened and filled with a bonding metallurgy and solder 8600 is disposed onto selected locations on the top metal layer 8500 as shown in FIG. 13. Solder pads 8600 serve as the I/O terminals for the stacked 3DI device wafer. The stacked structure is diced into individual chips and flip chip joined to suitable packaging carriers (not shown) for use in product applications.

Although a metal to metal bonding structure and process sequence was used to illustrate the inventive use of the BOX layer in making a 3DI stack other bonding methods such as transfer joining using metal to metal and adhesive bonding as well as use of lock and key features on the wafers to enable greater precision in alignment can be readily used in conjunction with the BOX layer method disclosed herein.

Although only one SOI based device layer is described as attached at the top of the bottom unthinned wafer, it is possible to extend the present inventive method to sequentially stack and thin additional SOI based device wafers on top with through vias extending to their respective BOX layers resulting in a multi-tiered device stack.

In another variant of the inventive method a sacrificial fill material such as polycrystalline or amorphous silicon can be filled in after the step of forming the via openings 1400 and 1500 to act as a temporary place holder that is thermally durable during the subsequent steps of the process. This sacrificial material is then removed by a suitable etch process after the step of removing the silicon body 1000 post bonding to the second wafer. A suitable conductive material such as copper, nickel or cobalt can then be filled into the openings 1400 and 1500 made accessible after this etch step. This sequence allows the filling of the vias 1400 and 1500 choosing from a wider range of conductive metals as the requirement of thermal stability is less stringent. Higher conductivity fillers like Cu are more advantageously incorporated to form the filled vias 1800 and 1900 by using this processing scheme.

Thus in one embodiment we provide a structure, which we also describe herein as an article of manufacture, comprising at least two bonded device layers of which at least one first device layer comprises silicon on insulator (SOI) circuits disposed on a buried oxide (BOX) layer, a first set of middle of the line (MOL) interconnects and a first set of back end of the line (BEOL) interconnects disposed thereon, the first device layer further being flipped and bonded atop a second device layer located on its parent wafer and comprising a second set of circuits, a second set of middle of line interconnects and a second set of BEOL interconnects, and the first and second device layers being interconnected together by means of metal filled vias located within the first set of MOL interconnects and the BOX layer of the first device layer and connecting on one end to bonding pads on the surface closest to the second device layer and on the other end to metal features provided on a third set of interconnects located atop the BOX surface not directly in contact with the SOI circuits of the first device layer, thus forming an enhanced 3D device stack.

In another embodiment the structure comprises input output terminals atop a third set of BEOL interconnects of the at least one first device layer to enable connection of the enhanced 3D device stack to packaging substrates of an electronic system. The electronic system comprises semiconductor chips, semiconductor arrays or wafer or IC electronic components and other components such as but not limited to micro-electro-mechanical (MEMS) components. In another embodiment some of the vias are used as alignment marks in the lithographic fabrication of the third set of BEOL interconnects on the first device layer. Additionally, the vias range in height from about 0.25 micron to about 2 um and or from about 0.5 to about 1.0 micron enabling ease of patterning and filling with metal.

Another aspect of the invention comprises a method of fabricating an enhanced 3D device stack comprising the steps of:

fabricating silicon on insulator (SOI) circuits on a first SOI wafer with a buried oxide (BOX) layer;

providing a first set of middle of the line (MOL) interconnects for the SOI circuits;

patterning and etching a set of vias and alignment marks that extend from the top surface of the first set of MOL interconnects to the bottom surface of the BOX layer;

filling and planarizing the vias and the alignment marks with a sacrificial fill material or a metal;

completing a first set of BEOL interconnects to connect the SOI circuits;

providing a first set of bonding pad level atop the first set of BEOL interconnects;

fabricating a second device wafer with a set of circuits, second set of MOL interconnects, a second set of BEOL interconnects and a second set of bonding pads;

flipping the first SOI wafer, positioning it atop the second device wafer such that the first and the second set of bonding pads are aligned to each other;

bonding the first SOI wafer and the second device wafer together by applying elevated temperature and pressure to bond the first and second set of bonding pads;

removing the silicon substrate from the first SOI wafer by a grinding, polishing or etching or combinations thereof and stopping on the BOX layer and exposing the sacrificial material filled vias or the metal filled vias and alignment marks;

where sacrificial material filled vias are used, etching out the sacrificial material, refilling and planarizing the vias and alignment marks with a conductive fill material;

fabricating a third set of interconnects atop the BOX layer using the alignment marks or the sacrificial material filled alignment marks as reference and connecting to the exposed ends of the vias; and providing input output pads and solder connection means atop the top surface of the third set of interconnects to enable connections to a packaging substrate, where the packaging substrate comprises semiconductor chips, semiconductor arrays or wafer or IC electronic components and other components such as but not limited to micro-electro-mechanical (MEMS) components. The sacrificial fill material is selected to be thermally stable through the steps of fabricating the first set of BEOL interconnects and the step of bonding of the first device wafer to the second device wafer and removable after the step of removing the silicon substrate of the first SOI wafer. The sacrificial fill material may comprise polycrystalline silicon and amorphous silicon or mixtures thereof, and the conducting fill material may comprise copper, nickel, ruthenium and cobalt or mixtures thereof or alloys thereof.

A further embodiment of the invention comprises the process of paragraph [0047] wherein the step of bonding of the first device wafer to the second device wafer is done at a temperature between about 300 C to about 400C and at a pressure between about 100 psi to about 300 psi. Additionally, the sacrificial fill material may be selected to be thermally stable through the steps of fabricating the first set of BEOL interconnects and the step of bonding of the first device wafer to the second device wafer, and removable after the step of removing the silicon substrate of the first SOI wafer. Also, the sacrificial fill material may comprise polycrystalline silicon or amorphous silicon or mixtures thereof. In addition, the conducting fill material may be selected from the group comprising copper, nickel, ruthenium and cobalt or alloys thereof or mixtures thereof. In a further embodiment, the process steps associated with the fabrication of the first SOI wafer, bonding, removing the silicon wafer body below the BOX layer, and providing additional interconnects atop the BOX layer may be repeated using additional SOI wafers so as to enable the incorporation of more than two device layers in the 3D stack.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameter herein, such as a numerical value, including values used to describe numerical ranges, means slight variations in the parameter. In another embodiment, the terms "about," "substantial," or "substantially," when employed to define numerical parameter include, e.g., a variation up to five percent, ten percent, or 15 percent, or somewhat higher or lower than the upper limit of five percent, ten percent, or 15 percent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as any patent or patent application that this written description mentions including the references cited in such scientific journal articles and other articles, including internet sites, and such patent or patent application, are incorporated herein by reference in their entirety and for the purpose cited in this written description and for all other disclosures contained in such scientific journal articles and other articles, including internet sites as well as any patent or patent application and the aforesaid references cited therein, as any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A method of fabricating an enhanced 3D device stack comprising the steps of:
    fabricating silicon on insulator (SOI) circuits on a first SOI wafer with a buried oxide (BOX) layer;
    providing a first set of middle of the line (MOL) interconnects for said SOI circuits;
    patterning and etching a set of vias and alignment marks that extend from the top surface of said first set of MOL interconnects to the bottom surface of said BOX layer;
    filling and planarizing said vias and said alignment marks with a sacrificial fill material;

completing a first set of BEOL interconnects to connect said SOI circuits;

providing a first set of bonding pad level atop said first set of BEOL interconnects;

fabricating a second device wafer with a set of circuits, second set of MOL interconnects, a second set of BEOL interconnects and a second set of bonding pads;

flipping said first SOI wafer, positioning atop said second device wafer such that said first and said second set of bonding pads are aligned to each other;

bonding said first SOI wafer and said second device wafer together by applying elevated temperature and pressure to bond said first and second set of bonding pads;

removing said silicon substrate from said first SOI wafer by grinding, polishing or etching or a combination thereof and stopping on said BOX layer and exposing said sacrificial material filled vias and alignment marks;

etching out said sacrificial material, refilling and planarizing said vias and alignment marks with a conductive fill material;

fabricating a third set of interconnects atop the BOX layer using said conducting material filled alignment marks as reference and connecting the structure so obtained to the exposed ends of said filled vias; and providing input out pads and solder connection means atop the top surface of said third set of interconnects to enable connections to a packaging substrate.

2. A method according to claim 1 wherein said step of bonding of said first device wafer to said second device wafer is done at a temperature between about 300 C to about 400 C and at a pressure between about 100 psi to about 300 psi.

3. A method according to claim 1 wherein said sacrificial fill material is selected to be thermally stable through the steps of fabricating said first set of BEOL interconnects and said step of bonding of said first device wafer to said second device wafer and removable after the step of removing the said silicon substrate of said first SOI wafer.

4. A sacrificial fill material according to claim 3 comprises polycrystalline silicon or amorphous silicon or mixtures thereof.

5. A conducting fill material according to claim 1 which is selected from the group comprising copper, nickel, ruthenium and cobalt or alloys thereof or mixtures thereof.

6. A method according to claim 1 wherein the process steps associated with the fabrication of the first SOI wafer, bonding, removing the silicon wafer body below the BOX layer, and providing additional interconnects atop the BOX layer are repeated using additional SOI wafers so as to enable the incorporation of additional device layers in the 3D stack.

7. A method of fabricating an enhanced 3D device stack comprising the steps of:

fabricating silicon on insulator (SOI) circuits on a first SOI wafer with a buried oxide (BOX) layer;

providing a first set of middle of the line (MOL) interconnects for said SOI circuits;

patterning and etching a set of vias and alignment marks that extend from the top surface of said first set of MOL interconnects to the bottom surface of said BOX layer;

filling and planarizing said vias and said alignment marks with metal;

completing a first set of BEOL interconnects to connect said SOI circuits;

providing a first set of bonding pad level atop said first set of BEOL interconnects;

fabricating a second device wafer with a set of circuits, second set of MOL interconnects, a second set of BEOL interconnects and a second set of bonding pads;

flipping said first SOI wafer, positioning it atop said second device wafer such that said first and said second set of bonding pads are aligned to each other;

bonding said first SOI wafer and said second device wafer together by applying elevated temperature and pressure to bond said first and second set of bonding pads;

removing the silicon substrate from said first SOI wafer by a grinding, polishing and etching or combinations thereof and stopping on said BOX layer and exposing said metal filled vias and alignment marks;

fabricating a third set of interconnects atop the BOX layer using said alignment marks as reference and connecting to the exposed ends of said vias; and providing input output pads and solder connection means atop the to surface of said third set of interconnects to enable connections to a packaging substrate, wherein said step of bonding of said first device wafer to said second device wafer is done at a temperature between about 300 C to about 400 C and at a pressure between about 100 psi to about 300 psi.

8. A method of fabricating an enhanced 3D device stack comprising the steps of:

fabricating silicon on insulator (SOI) circuits on a first SOI wafer with a buried oxide (BOX) layer;

providing a first set of middle of the line (MOL) interconnects for said SOI circuits;

patterning and etching a set of vies and alignment marks that extend from the top surface of said first set of MOL interconnects to the bottom surface of said BOX layer;

filling and planarizing said vias and said alignment marks with metal;

completing a first set of BEOL interconnects to connect said SOI circuits;

providing a first set of bonding pad level atop said first set of BEOL interconnects;

fabricating a second device wafer with a set of circuits, second set of MOL interconnects, a second set of BEOL interconnects and a second set of bonding pads;

flipping said first SOI wafer, positioning it atop said second device wafer such that said first and said second set of bonding pads are aligned to each other;

bonding said first SOI wafer and said second device wafer together by applying elevated temperature and pressure to bond said first and second set of bonding pads;

removing the silicon substrate from said first SOI wafer by a grinding, polishing and etching or combinations thereof and stopping on said BOX layer and exposing said metal filled vias and alignment marks;

fabricating a third set of interconnects atop the BOX layer using said alignment marks as reference and connecting to the exposed ends of said vias; and providing input output pads and solder connection means atop the top surface of said third set of interconnects to enable connections to a packaging substrate, wherein the process steps associated with the fabrication of the first SOI wafer, bonding, removing the silicon wafer body below the BOX layer, and providing additional interconnects atop the BOX layer is repeated using additional SOI wafers so as to enable the incorporation of more than two device layers in the 3D stack.

* * * * *